(12) United States Patent
Stefanov et al.

(10) Patent No.: US 8,217,448 B2
(45) Date of Patent: Jul. 10, 2012

(54) SEMICONDUCTOR DEVICE AND METHOD OF FORMING A SEMICONDUCTOR DEVICE

(75) Inventors: Evgueniy Stefanov, Vielle Toulouse (FR); Alain Deram, Colomiers (FR); Jean-Michel Reynes, Pompertuzat (FR)

(73) Assignee: Freescale Semiconductor, Inc., Austin, TX (US)

( * ) Notice: Subject to any disclaimer, the term of this patent is extended or adjusted under 35 U.S.C. 154(b) by 430 days.

(21) Appl. No.: 12/522,033

(22) PCT Filed: Jan. 4, 2007

(86) PCT No.: PCT/IB2007/000522
§ 371 (c)(1),
(2), (4) Date: Jul. 2, 2009

(87) PCT Pub. No.: WO2008/081225
PCT Pub. Date: Jul. 10, 2008

(65) Prior Publication Data
US 2010/0109078 A1    May 6, 2010

(51) Int. Cl.
*H01L 21/336*    (2006.01)
*H01L 29/78*    (2006.01)

(52) U.S. Cl. ........ 257/327; 257/335; 257/339; 257/341; 257/342; 257/346; 257/409; 257/E29.262; 257/E29.257; 257/E27.06; 257/E21.629; 257/E21.41; 438/268; 438/289; 438/301; 438/306

(58) Field of Classification Search .................. 257/327, 257/335, 339, 341, 342, 346, 409, E29.262, 257/E29.257, E27.06, E21.629, E21.41; 438/268, 438/289, 301, 306
See application file for complete search history.

(56) References Cited

U.S. PATENT DOCUMENTS

| 5,130,767 A | 7/1992 | Lidow et al. |
| 6,747,312 B2 | 6/2004 | Boden, Jr. |

(Continued)

FOREIGN PATENT DOCUMENTS

EP    0772244 A1    5/1997

(Continued)

OTHER PUBLICATIONS

International Search Report for PCT Application No. PCT/IB2007/000522 issued Jul. 27, 2007.

*Primary Examiner* — Evan Pert

(57) ABSTRACT

A method of forming a semiconductor device comprises providing a semiconductor substrate, providing a semiconductor layer of a first conductivity type over the semiconductor substrate, forming a first region of the first conductivity type in the semiconductor layer, and forming a control region over the semiconductor layer and over part of the first region. A mask layer is formed over the semiconductor layer and outlines a first portion of a surface of the semiconductor layer over part of the first region. Semiconductor material of a second conductivity type is provided to the outlined first portion to provide a second region in the semiconductor layer. The first region and second region are driven into the semiconductor layer so as to form a pre-control region of the first conductivity type extending into the semiconductor layer from the surface and under a portion of the control region and a graded body region of the second conductivity type extending into the semiconductor layer under the pre-control region. A body region is formed by providing semiconductor material of the second conductivity type to the outlined first portion. The body region extends into the pre-control region. A current electrode region is formed in the body region.

20 Claims, 9 Drawing Sheets

U.S. PATENT DOCUMENTS

| | | |
|---|---|---|
| 6,773,977 B1 | 8/2004 | Reynes et al. |
| 6,930,356 B2 | 8/2005 | Choi et al. |
| 6,972,231 B2 | 12/2005 | Boden, Jr. |
| 2003/0057478 A1 | 3/2003 | Yun et al. |
| 2003/0205829 A1 | 11/2003 | Boden, Jr. |
| 2004/0183127 A1 | 9/2004 | Boden, Jr. |

FOREIGN PATENT DOCUMENTS

| | | |
|---|---|---|
| EP | 1387408 A1 | 2/2004 |
| JP | 08288303 A | 11/1996 |
| WO | 03107432 A1 | 12/2003 |

SEMICONDUCTOR DEVICE AND METHOD OF FORMING A SEMICONDUCTOR DEVICE

FIELD OF THE DISCLOSURE

This disclosure relates to semiconductor device and methods of forming a semiconductor device.

BACKGROUND

Semiconductor devices such as Metal Oxide Semiconductor Field Effect Transistors (MOSFETs) are commonly used as power devices in applications, such as automotive electronics, power supplies, telecommunications, which applications require devices to operate at currents in the range of tenths up to hundreds of amperes (A).

Conventionally, by applying an appropriate voltage to the gate electrode of a MOSFET device, the device is turned on (i.e. in an on state) and a channel will be formed connecting the source and the drain regions allowing a current to flow. Once the MOSFET device is turned on, the relation between the current and the voltage is nearly linear which means that the device behaves like a resistance. The resistance is referred to as the on-state resistance Rdson.

Typically, MOSFET devices with low on-state resistance Rdson are preferred as they have higher current capability. It is well known that the on-state resistance Rdson may be decreased by increasing the packing density of a MOSFET device i.e. the number of base cells per $cm^2$. For example, a hexagonal MOSFET (HEXFET) device comprises a plurality of cells, each cell having a hexagonal polysilicon gate and source and body regions forming vertices of the hexagonal polysilicon gate, and has a high packing density e.g. $10^5$ hexagonal cells per $cm^2$. Usually, the smaller the size of the cells, the higher is the packing density and thus, the smaller the on-state resistance. Therefore, many improvements to MOSFET devices are aimed at reducing the size of the cells.

When the device is turned off (i.e. in an off state), the voltage blocking capability is limited by the breakdown voltage. For high power applications, it is desirable to have a high breakdown voltage, for example, at least 200 volts.

European patent no. EP 1387408 discloses a Insulated Gate FET (IGFET) device in which the doping concentration in the epitaxial layer 11 between the source 5 and drain 3 regions does not vary substantially. The result is a 'T' shaped current flow 7 as shown in FIG. 1 between the source and drain regions during the on state of the IGFET device. The current path 7 extends generally parallel to the surface 9 of the epitaxial layer 11 from the source region 5 in the channel 13 and only extends vertically to the drain region 3 from the central part of the channel 13. The width of the current path is therefore restricted by the width of both the channel 13 and the drift region (which is the vertical part of the conductive path through the epitaxial layer 11) which limits the Rdson of the device. If the doping concentration of the epitaxial layer 11 is increased, the Rdson of the device will be increased but the breakdown voltage of the device will be decreased.

In order to increase the voltage capability of a MOSFET device, it is known to form a lightly doped drift region in the epitaxial layer between the drain region and the channel of a MOSFET device. The lightly doped drift region lowers the maximum electric field that develops around the PN junction formed between the body region 15 and the epitaxial layer when the device is in an off state and thus, ensures a higher breakdown voltage. However, reducing the doping in the drift region between the source and drain, increases the on-state resistance of the device.

There are other examples where techniques are employed to increase the breakdown voltage of a MOSFET device but which result in the increase in the on-state resistance Rdson. Thus, there is a trade-off between reducing Rdson and having a high enough break down voltage BVdss.

A need exists for improving the blocking voltage capability of a MOSFET device by increasing the device's breakdown voltage which does not compromise the on-state resistance Rdson.

U.S. Pat. No. 6,747,312 discloses a vertical MOSFET device in which an additional N-type region is formed between the source regions so as to increase the doping concentration in the channel. In addition, additional p-type regions are formed below the body regions of the MOSFET device. The additional p-type regions compensate for the increased doping of the additional N-type region so as to limit the impact on the breakdown voltage. However, further improvement in the trade off between Rdson and the breakdown voltage is desired. The additional regions of this MOSFET device are formed through thermal oxide layers and dedicated mask openings which significantly increases the cost of manufacturing the device.

There is therefore a need for an improved semiconductor device.

SUMMARY

The present invention provides a semiconductor device and a method of forming a semiconductor device as described in the accompanying claims.

BRIEF DESCRIPTION OF THE DRAWINGS

A semiconductor device and a method of forming a semiconductor device in accordance with the present disclosure will now be described, by way of example only, with reference to the accompanying drawings in which.

DETAILED DESCRIPTION OF THE PREFERRED EMBODIMENTS

In the description that follows and in FIGS. 2-9 certain regions are identified as being of a particular material, conductivity and/or type. However, this is merely for convenience of explanation and not intended to be limiting. Those of skill in the art will understand based on the description given herein that various semiconductor materials can be used and that the doping of various regions of the device may be altered in order to obtain different device functions.

The present disclosure will be described with reference to a semiconductor device comprising a vertical semiconductor device such as a N-channel vertical MOSFET device. A vertical semiconductor device comprises a source electrode placed over the drain electrode which results in a current flow mainly in a vertical direction when the device is in the on state. It will be appreciated that the disclosure is not limited to vertical devices nor N-channel MOSFET devices and applies equally to other semiconductor devices, such as lateral devices, P-channel vertical MOSFET devices or insulated gate bipolar transistor (IGBT) devices, or JFETs or diodes or similar devices.

Figure 2:
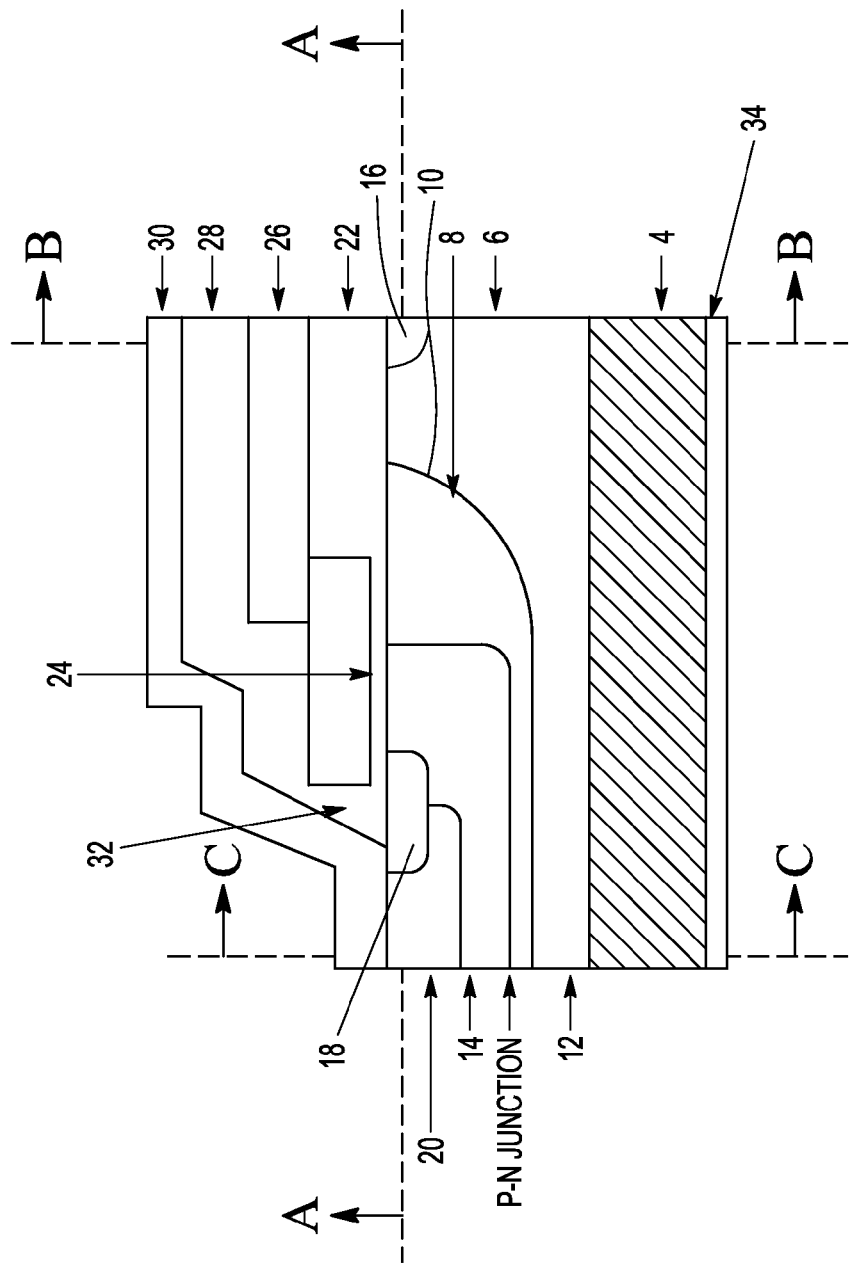
FIG. 2 is a schematic cross-section diagram of a portion of a semiconductor device arrangement in accordance with an embodiment of the disclosure.

Referring now to FIG. 2, a semiconductor device in accordance with an embodiment of the disclosure comprises a N-channel vertical MOSFET device. A MOSFET device typically comprises a plurality of transistor base cells having different shapes, such as hexagonal cells, fingers, strips, waves or the shape described in PCT application no. WO 03/107432. FIG. 2 and subsequent FIGs show a simplified cross-sectional view of only a portion of a base cell for simplicity.

The semiconductor device comprises a n-type semiconductor substrate 4 having a first surface and a second surface. A n-type epitaxial layer 6 is formed over the first surface of the semiconductor substrate 4. The doping concentration of the epitaxial layer 6 is less than the doping concentration of the semiconductor substrate 4. In an embodiment of the disclosure, the doping concentration of the n-type epitaxial layer 6 is greater than the doping concentration of the epitaxial layer in known devices, such as that disclosed in WO 03/107432.

Figure 1:
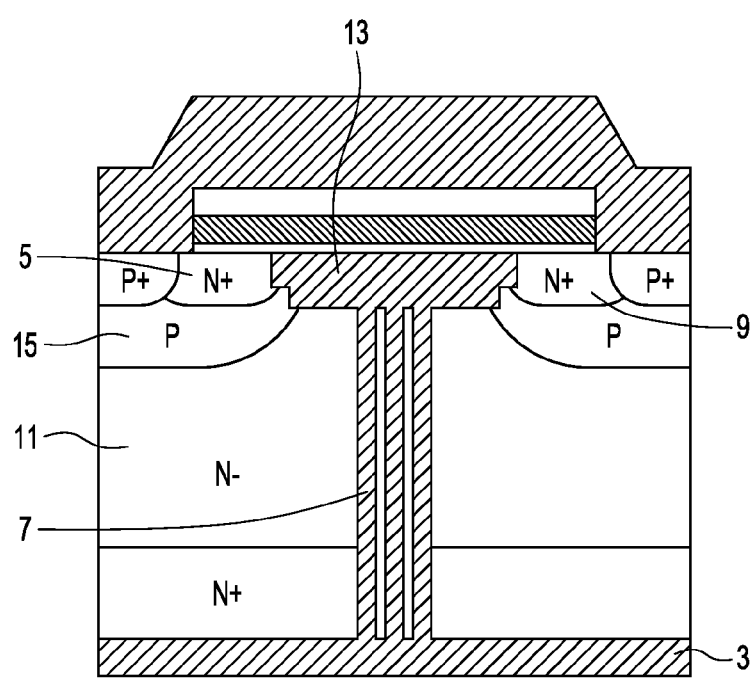
FIG. 1 is a schematic cross-section diagram of a portion of the IGFET described in European patent application EP 1387408.

A n-type pre-control region 8, which is referred to as a pre-gate implant (PGI) region, is formed in the epitaxial layer 6 and extends from a first surface 10 of the epitaxial layer 6 to a depth of 3-4 microns. A graded body region 12 extends into the epitaxial layer 6 under the PGI region 12. The graded body region 12 typically extends into the epitaxial layer 6 to a depth of 4 to 5 microns from the first surface 10 to the substrate 4. A p-type body region 14 extends from the first surface 10 of the epitaxial layer 6 through the epitaxial layer 6 typically to a depth of 1.5 microns. The doping concentration of the body region 14 is greater than the doping concentration of the graded body region 12. A n-type region 18 extends from the first surface 10 of the epitaxial layer 6 into the p-type body region 14. The n-type region 18 is the current electrode region of the semiconductor device. In the embodiment shown in FIG. 1, the n-type region 18 is the source region 18 of the MOSFET device and the semiconductor substrate 4 forms the drain region of the device. An additional p-type region 20 extends into the p-type body region 14 from the first surface 16 of the epitaxial layer 6 and so as to be adjacent the n-type region 18. The doping concentration of the additional p-type region 20 is greater than the doping concentration of the p-type body region 14. P-type region 20 improves contact with the source electrode, reduces the parasitic NPN bipolar action in the body region 14 and avoids vertical punch through between the source region 18 and the n-type epitaxial layer 6.

A field oxide layer 22 extends over the first surface 10 of the epitaxial layer 6 and a gate oxide layer 24 extends over the first surface 10 of the epitaxial layer 6 over body region 14, and a portion of source region 18. Field oxide layer 22 and gate oxide layer 24 each typically comprises a silicon oxide layer. The gate oxide layer 24 has a typical thickness of 0.04-0.06 microns and the field oxide layer 22 has a thickness of typically 0.6 microns depending on the operating voltage. An insulated gate region 26 is formed over gate oxide layer 24 and field oxide layer 22 and typically comprises a doped polycrystalline semiconductor material such as polysilicon. A dielectric layer 28 is formed over the insulated gate region 26. The dielectric layer 28 may comprise a silicon oxide or TEOS layer or may comprise several layers, such as oxide/nitride/oxide layers.

In an embodiment of the disclosure, a n-type intermediate region 16 extends between the PGI regions 8 of a base cell (only one PGI region 8 is shown in FIG. 2) under the field oxide layer 22. The doping concentration of the n-type intermediate region 16 is less than the doping concentration of the epitaxial layer 6. The lightly doped intermediate region 16 is arranged to be under the field oxide layer 22 to avoid an increase in electric field in this area which helps to increase the breakdown voltage of the device.

The insulated gate region 26 extends over part of the PGI region 8, part of the body region 14 and part of the source region 18.

A metal or ohmic layer 30 is formed over the dielectric layer 28 and contacts the source region 18 to form the source electrode. A spacer 32 isolates the metal layer 30 from the insulated gate region 26. The metal layer 20 also contacts the body region 20 so that the source region and body region 20 are short-circuited.

A metal or ohmic layer 34 is formed over the second surface of the semiconductor substrate 4 to form the drain electrode.

The doping concentration in the graded body region 12 decreases across the graded body region 12 away from the PGI region 8. The doping concentration in the PGI region 8 decreases across the PGI region 8 away from the body region 14. The doping concentration in the epitaxial layer 6 increases across the epitaxial layer away from the first surface 10.

Figures 3A, 3B, 3C:
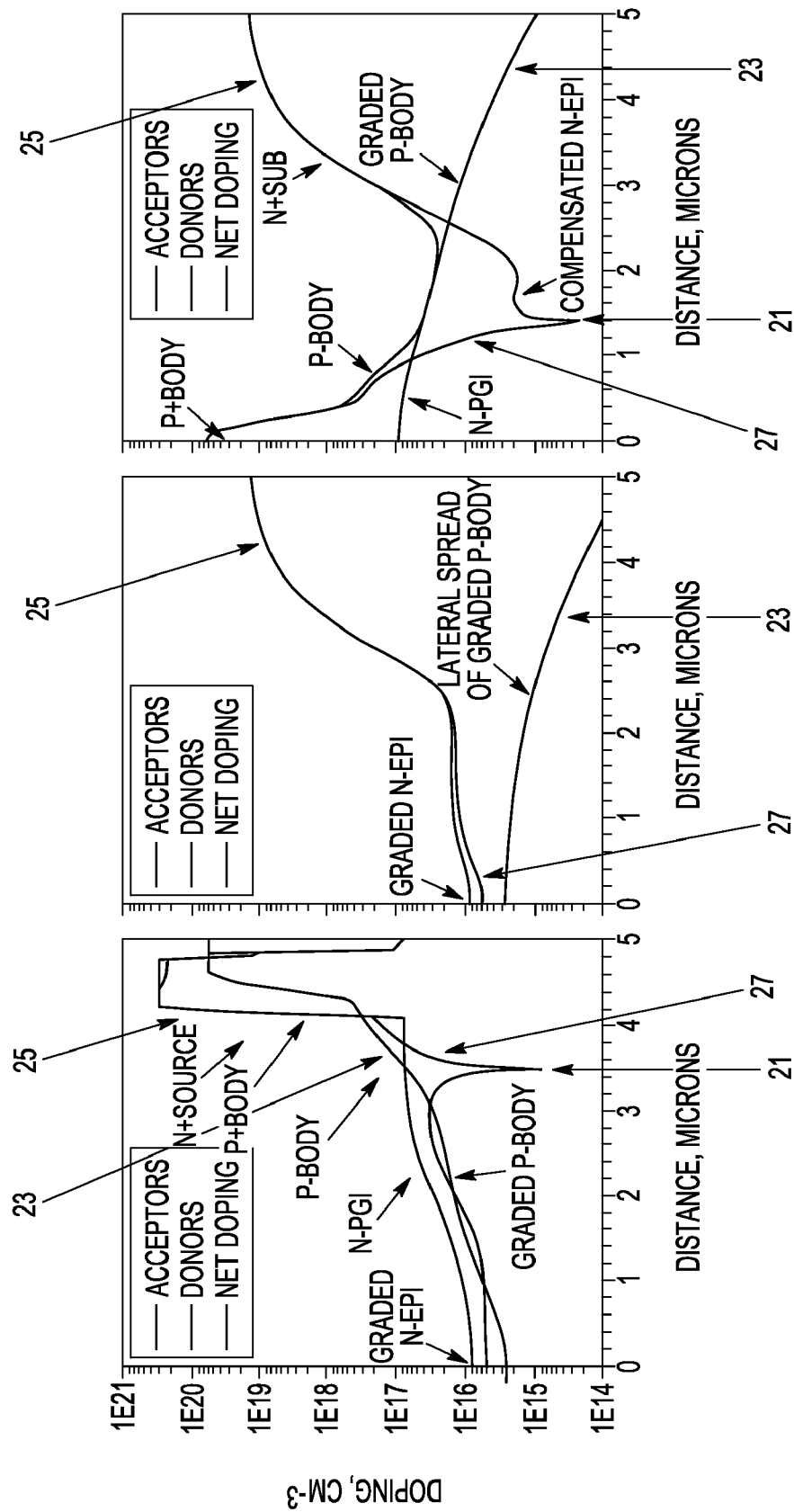
FIG. 3a is a graphical representation of the doping concentration profiles across the line A-A shown in FIG. 2.
FIG. 3b is a graphical representation of the doping concentration profiles across the line B-B shown in FIG. 2.
FIG. 3c is a graphical representation of the doping concentration profiles across the line C-C shown in FIG. 2.
Figure 4:
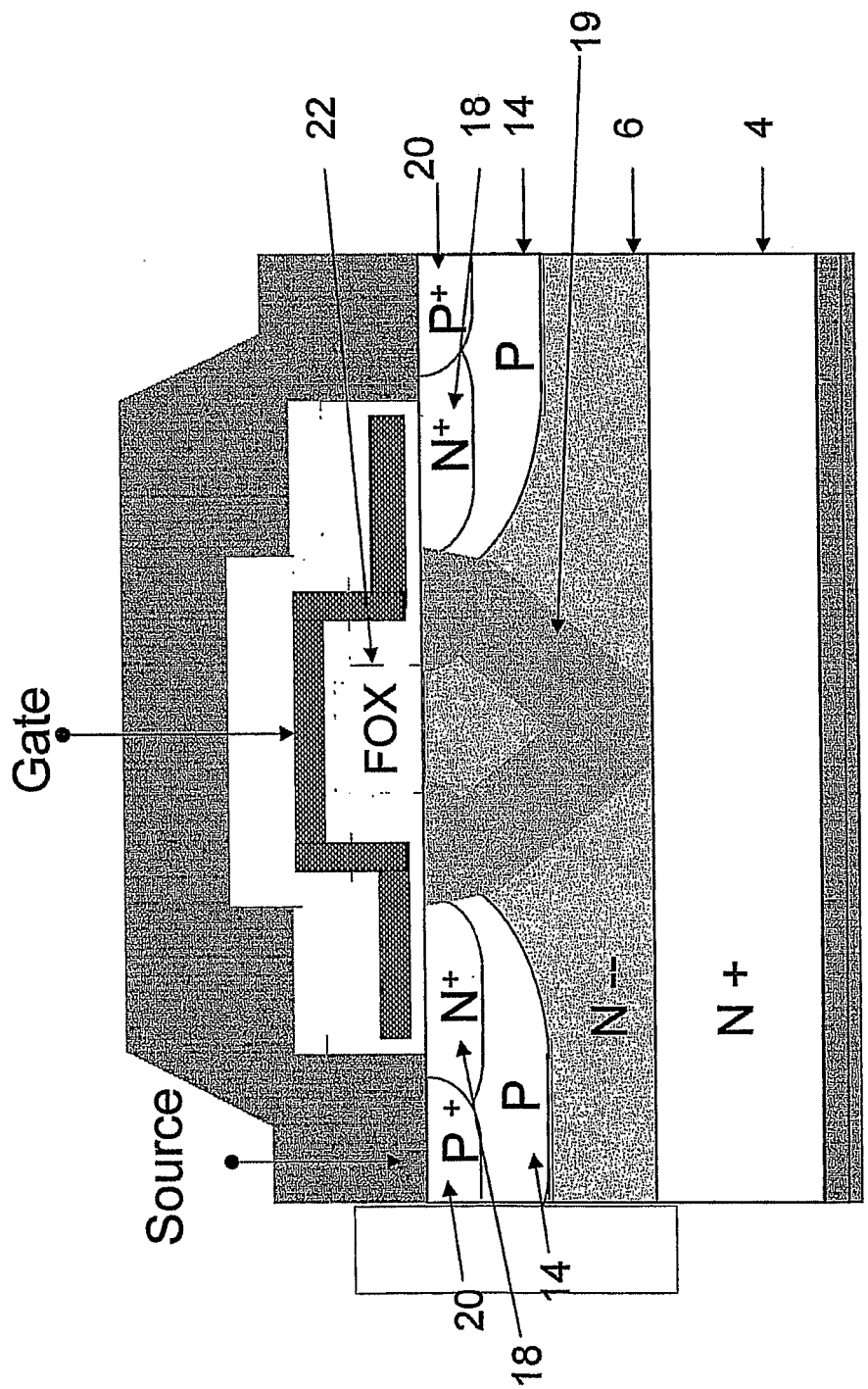
FIG. 4 is a schematic cross-section diagram of a portion of a semiconductor device arrangement in accordance with the disclosure showing the current flow when the device is an on state.

The doping concentration profiles and net doping concentration profiles of the MOSFET device in accordance with the disclosure are shown in FIGS. 3a-3b. The doping concentration profile for p-type regions is shown by curve 23, the doping concentration profile for n-type regions is shown by curve 25 and the net doping concentration profiles across the regions is shown by curve 27. FIG. 3a shows the lateral doping profile of across line A-A of FIG. 2. FIG. 3b shows the vertical doping profile across line B-B of FIG. 2. FIG. 3c shows the vertical doping profile across line C-C of FIG. 2. Point 21 in FIG. 3a represents the PN junction between the body region 14 and the PGI region 8 and the point 21 in FIG. 3c represents the PN junction between the graded body region 12 and the epitaxial layer 6. As can be seen by the net doping concentration profiles in these FIGs., the net doping concentration at the PN junction is less with the graded body region 12 than it would have been without. This means that the critical electric field at which breakdown occurs will be greater with the graded body region 12 than without.

The PGI region 8 increases the n-type doping concentration in the epitaxial layer 6 around the body region 14 compared to the rest of the epitaxial layer 6. By having a higher doping concentration around the body region 14, the width of the current path from the source region 18 is increased which results in Rdson being reduced. This can be seen in FIG. 4, which shows the current path during the on state of the MOSFET device in accordance with the disclosure. The current path 19 between the source region 18 and drain region 4 is a 'v' shape due to the more highly doped PGI regions 8 around the body region 14 and the graded body region 12: the graded body region 12 has a higher resistance compared to the PGI region 8 so the preferred current path is through the PGI region 8 to the centre of the cell.

The graded body region 12 compensates for the higher n-type doping concentration provided by the PGI region 8, and the higher doped epitaxial layer, if used, by reducing the net doping concentration in the epitaxial layer 6 under the PN junction formed between the body region 14 and the PGI region 8. The graded body region 12 provides for a less abrupt PN junction which results in a decrease in the electric field and then breakdown occurs at a higher reverse bias.

The result is that as the graded body region 12 compensates for the PGI region 8, Rdson can be decreased without reducing the breakdown voltage or the breakdown voltage can be increased without increasing Rdson.

A method of forming a semiconductor device in accordance with an embodiment of the present disclosure will now be described with reference to FIGS. 5-9. Only part of the semiconductor device is shown for simplicity.

Figure 5:
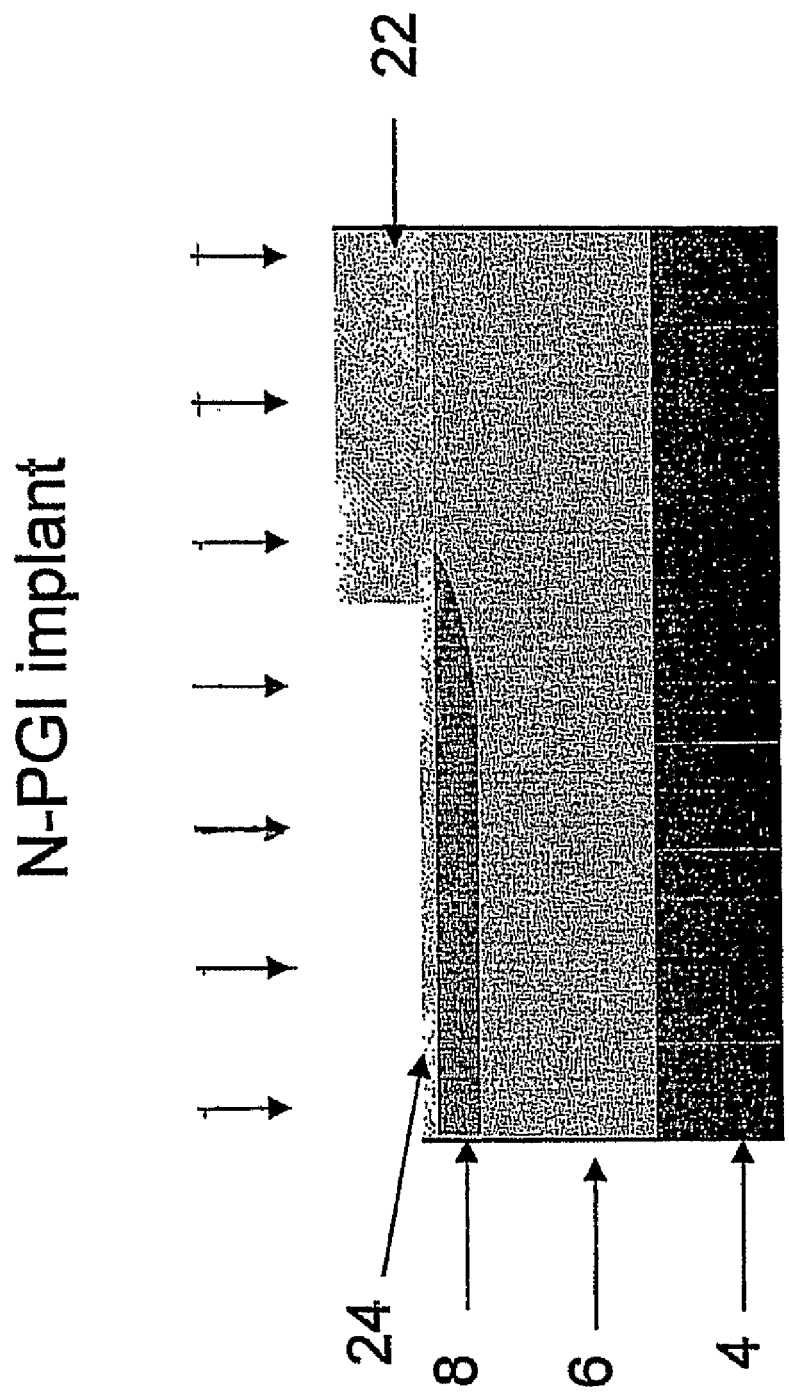
FIGS. 5-9 are schematic cross-section diagrams of the portion of the semiconductor device of FIG. 2 during different stages of fabrication.

As shown in FIG. 5, an n-type epitaxial layer 6 is grown on an n-type substrate 4. The doping concentration of the n-type substrate 4 is greater than the doping concentration of epitaxial layer 6. In an embodiment, the doping concentration of the epitaxial layer 6 is approximately $1.5e16$ cm$^{-3}$. This compares to a doping concentration of $1.0e16$ cm$^{-3}$ for an epitaxial layer of a typical device.

In an embodiment of the MOSFET device in accordance with the disclosure which includes a n-type intermediate lightly doped region 16 in the epitaxial layer 6 between the PGI regions 8, the intermediate region 16 is formed by reducing the doping concentration in the epitaxial layer 6 during the final stages of growing the epitaxial layer on the substrate 4 so as to provide a layer of reduced doping concentration at the surface 10 of the epitaxial layer 6 which remains as intermediate region 16 after the source 18, body 14 and PGI 8 regions are formed in the epitaxial layer 6. For simplicity, the lightly doped layer 16 at the surface of the epitaxial layer 6 is not shown in the FIGs.

A dielectric layer 22, such as a silicon oxide layer, is then formed over the device. A first opening (not shown) is made through the dielectric layer 22 (the field oxide layer 22) by way of patterning and etching and a dielectric layer 24, the gate oxide layer 24, is grown on the epitaxial layer 6 in the first opening (not shown). The PGI region 8 is then formed in the epitaxial layer 6 by a blanket implant of n-type material such as arsenic or phosphorous into the epitaxial layer 6. The doping does of the n-type material is in the range of $1-3e12$ cm$^{-2}$.

Figure 6:
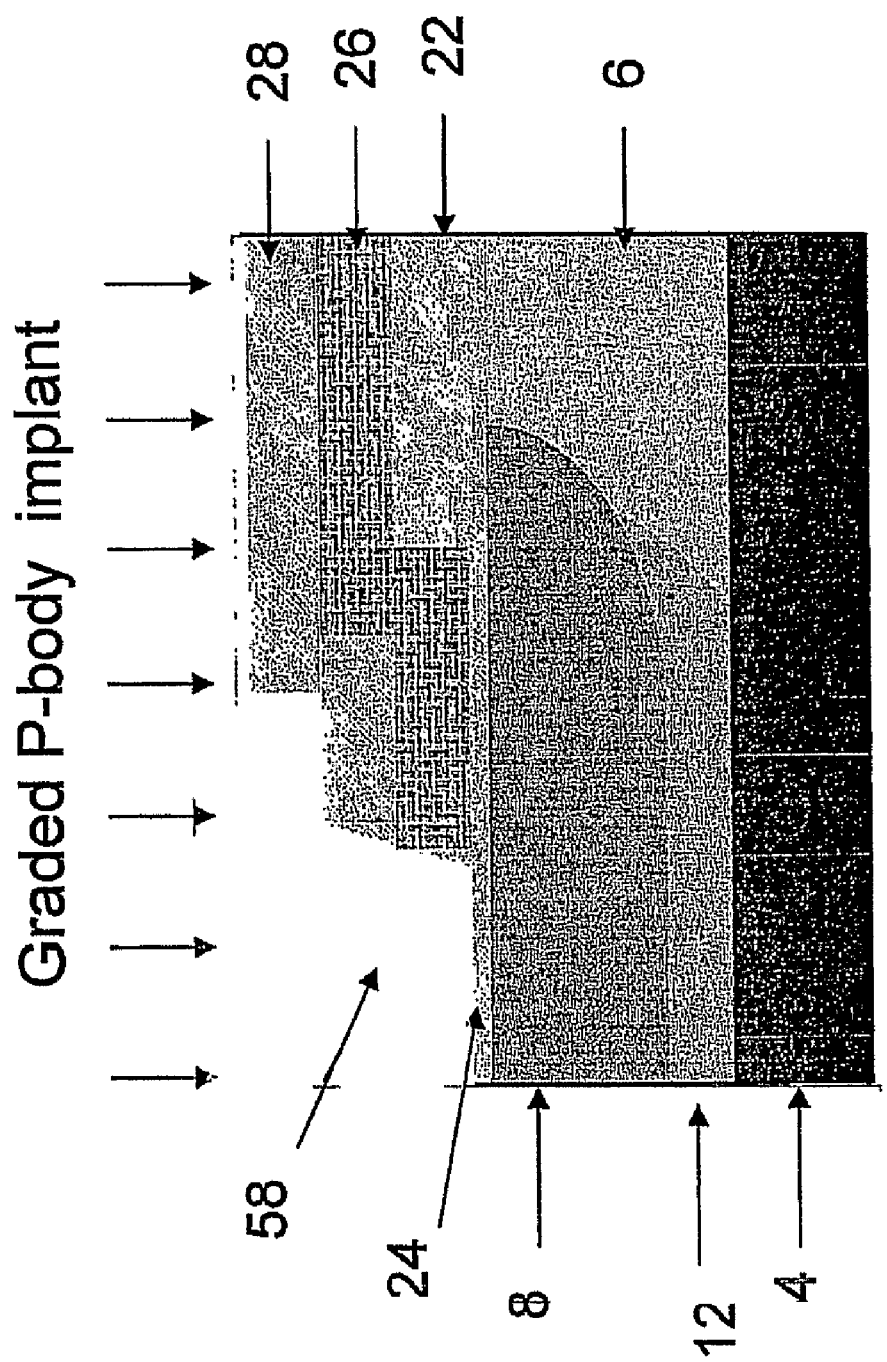

In FIG. 6, a polysilicon layer 26, or other type of conductive layer, is then formed over the gate oxide layer 24 and the field oxide layer 22, for example, by deposition and doped with a high dose n-type implantation. A dielectric layer 28 is then deposited over the polysilicon layer 26. The dielectric layer 28 may comprise a silicon oxide or TEOS layer or may comprise several layers, such as oxide/nitride/oxide layers. The etched polysilicon layer 26 forms the insulated gate region 26 of the MOSFET device.

The dielectric layer 28 and the polysilicon layer 26 are then etched to provide a body opening 58 through which p-type material, such as boron, having a doping dose in the range of $1-2e13$ cm$^{-2}$ is implanted in order to form the graded body region 12. After implanting the graded body region 12, the device is subject to a high temperature thermal drive operation (for example, 1150° C. for 100 minutes) in which the PGI region 8 and graded body region 12 diffuse through the epitaxial layer 6. The n-type material of the PGI region 8 diffuses at a slower rate than the p-type material of the graded body region 12 with the result that the graded body region 12 extends a greater depth vertically into the epitaxial layer 6 compared to the PGI region 8 after the high temperature thermal drive operation. Due to the fact that the PGI region 8 was implanted through a larger opening, the graded body region 12 does not extend beyond the PGI region laterally. Thus, the lateral spread of the graded body region 12 is compensated for by the PGI region.

Figure 7:
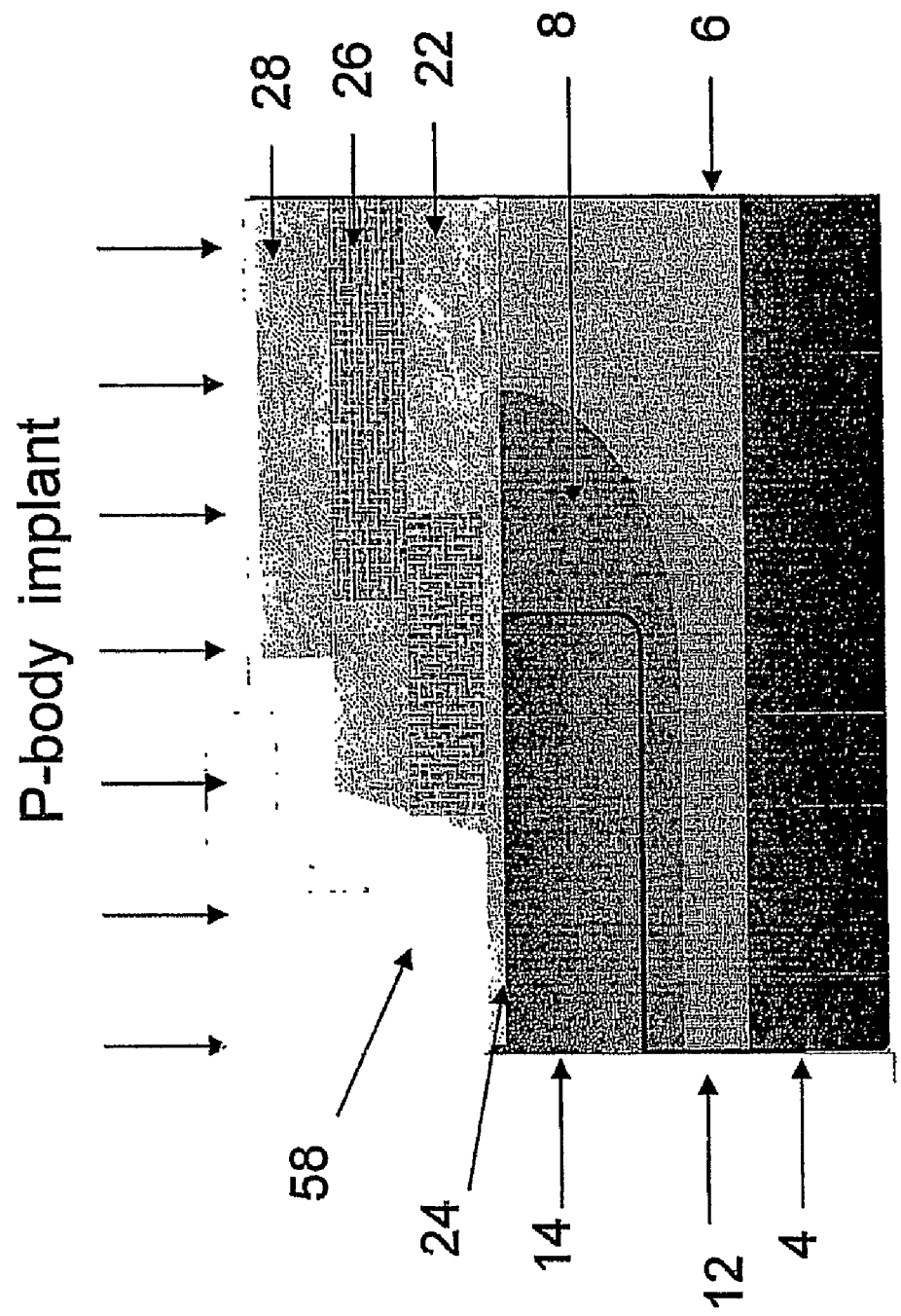

The p-type body region 14 is then formed by implantation or diffusion of a p-type material, such as boron (B11+), in the epitaxial layer 6 through the body opening 58. Preferably, a doping dose in the range of $5e13$ cm$^{-2}$ is used. The wafer is then subjected to a high temperature, for example around 1080° C., to drive the p-type body region 14 into the epitaxial layer 6 as shown in FIG. 7. The doping concentration of the body region 14 is greater than the doping concentration of the graded body region 12.

Figure 8:
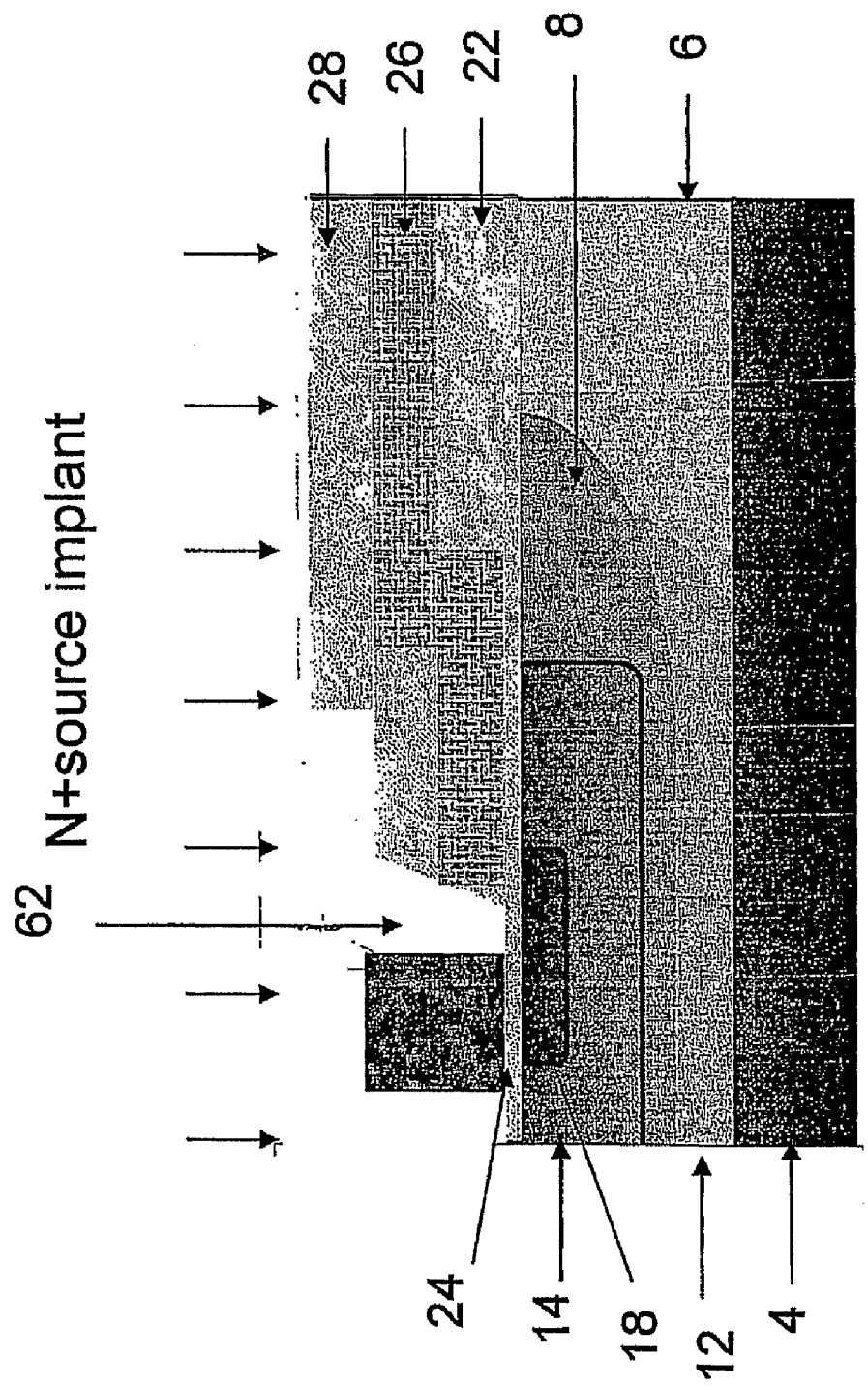

A mask 60 is formed over a portion of the dielectric layer 28 to mask off the body opening 58 and leave an opening 62 as shown in FIG. 8. The source region 18 is then formed by implantation of a n-type material, such as arsenic or phosphorus, into the epitaxial layer 6. Since the graded body region 12, the body region 14 and the source region 18 are all implanted through the openings 58 and 62 which is defined by the insulated gate region 26, the source region 18, the graded body region 12 and the body region 14 are self-aligned.

Figure 9:
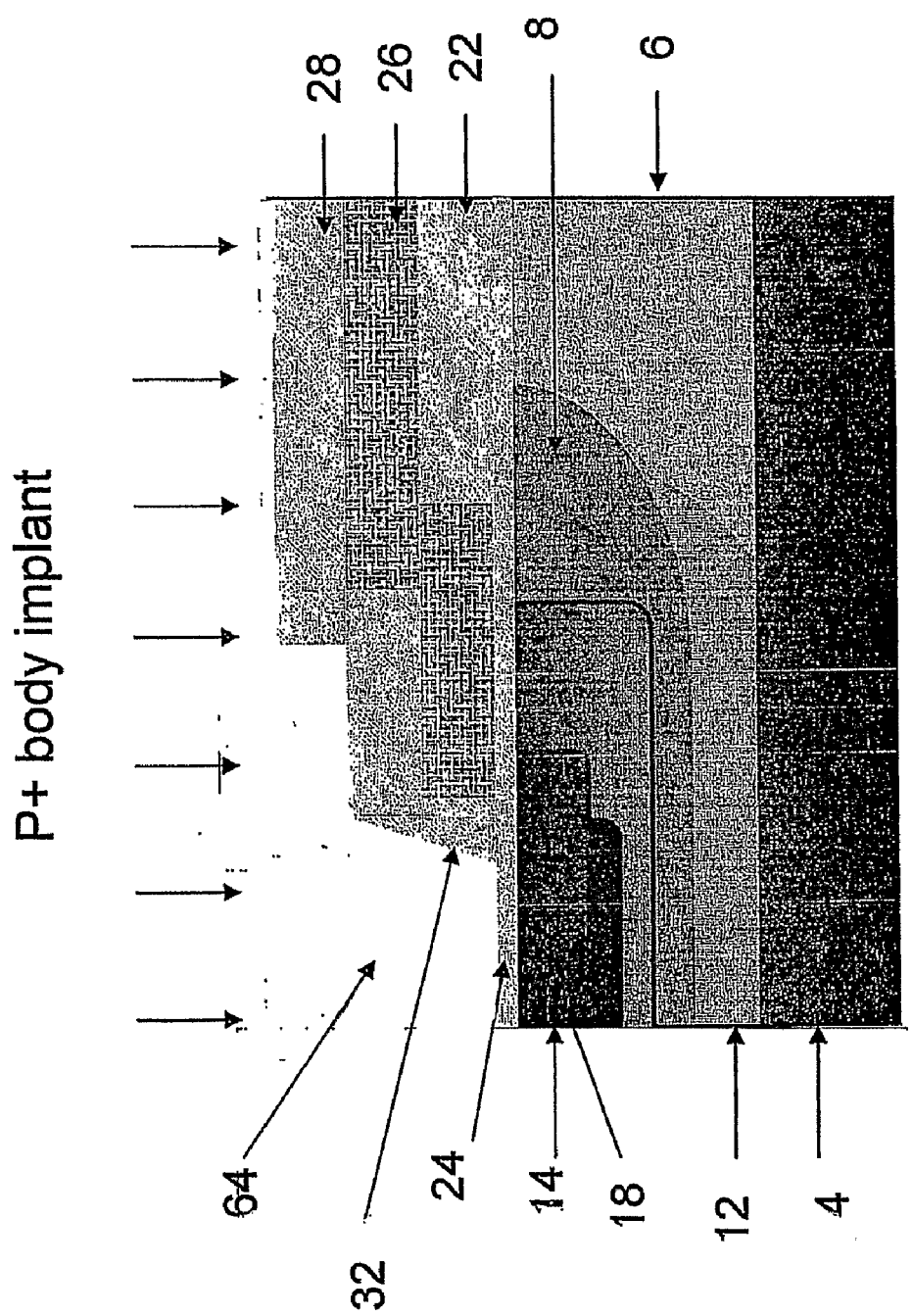

Referring now to FIG. 9, a dielectric layer (not shown), such as a TEOS layer, is formed over the dielectric layer 28 and the gate oxide layer 24. This dielectric layer (not shown) and the gate oxide layer 24 are then etched to provide a spacer 32 and opening 64, through which p-type material is implanted to form the additional p-type region 20. Preferably, the implant step comprises implanting a p-type material, such as born (B11+), having a doping dose of about $5e15$ cm$^{-2}$.

The partly processed semiconductor device is then subjected to a low thermal operation and short drive so as to drive the source region 18, body region 14, and additional p-type region 20 into the epitaxial layer 6. For example, the semiconductor device is annealed up to a temperature of 900-950° C. for 30 minutes. Other process steps then take place including metallization wherein a metal layer 30 is formed on the dielectric layer 28 in contact with the source region 18 and additional p-type region 20 so as to provide the source electrode, and a metal layer 34 is formed over the second surface of the semiconductor substrate 4 to form the drain electrode as shown in FIG. 2. The spacer 32 isolates the source electrode 30 from the insulated gate region 26.

It will be appreciated that since the PGI region is formed by a blanket implant and the graded body region is formed through the same mask opening as the body region, the method in accordance with the present invention does not require additional thermal oxide layers nor additional mask layers in order to form the PGI regions and the graded body regions. Thus, the present invention does not increase significantly the manufacturing costs.

Furthermore, since the formation of the graded body region is aligned to the insulated gate region, the graded body region is self aligned to the body region and the source region which ensures that the MOSFET device operates symmetrically. This provides a device with a well controlled threshold voltage.

In summary, the present invention provides an improved semiconductor device that has a graded body region under a PGI region which provides for a new device configuration which allows for a reduction in Rdson but whilst also ensuring the breakdown voltage is not reduced. Thus, the present invention improves the trade-off between reducing Rdson and having a high enough break down voltage BVdss.

The new device configuration has a 'V' shaped current path between the source and drain regions in the on state which means that the width of the current path through the drift region is increased compared to the typical 'T' shaped devices with the result that Rdson is reduced. The graded body region compensates for the increased doping concentration in the PGI regions so that the breakdown voltage is not reduced. If the doping concentration of the epitaxial layer is increased with a view to reducing Rdson, the graded body region will also compensate for the higher doping concentration in the epitaxial layer below the body region so that the breakdown voltage is not reduced.

The invention claimed is:

1. A method of forming a semiconductor device comprising:
   providing a semiconductor substrate;
   providing a semiconductor layer of a first conductivity type over the semiconductor substrate;
   forming a first region of the first conductivity type in a part of the semiconductor layer;
   forming an insulated gate region over part of the semiconductor layer and over part of the first region;
   forming a mask layer over the semiconductor layer, the mask layer outlining a first portion of a surface of the semiconductor layer over part of the first region;
   providing a dopant of a second conductivity type to the outlined first portion to provide a second region in the semiconductor layer;
   driving the first region and second region into the semiconductor layer so as to form a pre-control region of the first conductivity type extending into the semiconductor layer from the surface and under a portion of the insulated gate region and a graded body region of the second conductivity type having a first doping concentration extending into the semiconductor layer under the pre-control region;
   providing a dopant of the second conductivity type to the outlined first portion to provide a body region having a second doping concentration extending into the pre-control region; and
   forming a current electrode region of the first conductivity type in the body region.

2. The method according to claim 1, wherein the first doping concentration of the graded body region decreases away from the pre-control region.

3. The method according to claim 1, wherein the graded body region extends under the pre-control region to the substrate.

4. The method according to claim 1, wherein the second doping concentration of the second conductivity type is greater than the first doping concentration of the second conductivity type.

5. The method according to claim 1, wherein the semiconductor layer has a first doping concentration of the first conductivity type and the pre-control region has a second doping concentration of the first conductivity type, wherein the second doping concentration is greater than the first doping concentration.

6. The method according to claim 1, wherein the substrate is of the first conductivity type and forms another current electrode region, and wherein in operation when the semiconductor device is in an on state, current flows in a current path between the current electrode region and the another current electrode region substantially through the body region, the pre-control region and the semiconductor layer, wherein the current paths of adjacent current electrode regions form a V shape to the another current electrode region.

7. The method according to claim 1, wherein the step of forming a first region comprises implanting a dopant of the first conductivity type into the semiconductor layer.

8. The method according to claim 1, wherein the driving step comprises a first thermal drive operation at a first temperature and wherein the step of providing a body region comprises performing a second thermal drive operation at a second temperature to drive the dopant of the second conductivity type into the pre-control region, wherein the first temperature is greater than the second temperature.

9. The method according to claim 1, wherein the step of forming a current electrode region comprises providing a dopant of the first conductivity type to a portion of the outlined first portion and into the body region.

10. The method according to claim 1, wherein the step of forming a mask layer comprises forming a dielectric layer over the insulated gate region and removing a portion of the dielectric layer and the insulated gate region to provide an opening which extends through the dielectric layer and the insulated gate region, and wherein the outlined first portion comprises the opening.

11. The method according to claim 1, wherein the step of forming a first region comprises providing a dopant of the first conductivity type in the semiconductor layer having a doping dose in the range of $1\text{-}3e12\ cm^{-2}$, wherein the step of providing a dopant of a second conductivity type to provide the second region comprises providing a dopant to the outlined first portion having a doping dose in the range of $1\text{-}2e13\ cm^{-2}$ and wherein the semiconductor layer has a doping concentration of approximately $1.5e16\ cm^{-3}$.

12. The method according to claim 1, wherein the doping concentration in the semiconductor layer increases across the semiconductor layer away from the surface.

13. A semiconductor device comprising:
   a semiconductor substrate of a first conductivity type;
   a semiconductor layer of the first conductivity type formed over the semiconductor substrate;
   an insulated gate region formed over part of a surface of the semiconductor layer;
   a pre-control region of the first conductivity type extending into the semiconductor layer from the surface of the semiconductor layer and under a portion of the insulated gate region;
   a graded body region of the second conductivity type and having a first doping concentration formed in the semiconductor layer and extending into the semiconductor layer under the pre-control region;
   a body region having a second doping concentration formed in the pre-control region and extending into the pre-control region from the surface; and
   current electrode region of the first conductivity type formed in the body region and extending into the body region from the surface, and
   wherein the substrate forms another current electrode region, and wherein in operation when the semiconductor device is in an on state, current flows in a current path between the current electrode region and the another current electrode region substantially through the body region, the pre-control region and the semiconductor layer, wherein the current paths of adjacent current electrode regions form a V shape to the another current electrode region.

14. The semiconductor device according to claim 13, wherein the first doping concentration of the graded body region decreases away from the pre-control region.

15. The semiconductor device according to claim 13, wherein the graded body region extends under the pre-control region to the substrate.

16. The semiconductor device according to claim 13, wherein the second doping concentration of the second conductivity type is greater than the first doping concentration of the second conductivity type.

17. The semiconductor device according to claim 13, wherein the semiconductor layer has a first doping concentration of the first conductivity type and the pre-control region has a second doping concentration of the first conductivity type, wherein the second doping concentration is greater than the first doping concentration.

18. The semiconductor device according to claim 13, wherein the doping concentration in the semiconductor layer increases across the semiconductor layer away from the surface.

19. The method according to claim 2, wherein the graded body region extends under the pre-control region to the substrate.

20. The method according to claim 2, wherein the second doping concentration of the second conductivity type is greater than the first doping concentration of the second conductivity type.

* * * * *